United States Patent
Yu et al.

(10) Patent No.: US 9,142,509 B2
(45) Date of Patent: Sep. 22, 2015

(54) COPPER INTERCONNECT STRUCTURE AND METHOD FOR FORMING THE SAME

(71) Applicant: TAIWAN SEMICONDUCTOR MANUFACTURING COMPANY, LTD., Hsinchu (TW)

(72) Inventors: Chen-Hua Yu, Hsinchu (TW); Shau-Lin Shue, Hsinchu (TW); Hsiang-Huan Lee, Jhudong Township (TW); Ching-Fu Yeh, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/332,866

(22) Filed: Jul. 16, 2014

(65) Prior Publication Data

US 2014/0327141 A1    Nov. 6, 2014

Related U.S. Application Data (63) Continuation-in-part of application No. 13/586,676, filed on Aug. 15, 2012.

(60) Provisional application No. 61/624,154, filed on Apr. 13, 2012.

(51) Int. Cl.
*H01L 23/48* (2006.01)
*H01L 23/532* (2006.01)
*H01L 21/768* (2006.01)

(52) U.S. Cl.
CPC .... *H01L 23/53238* (2013.01); *H01L 21/76846* (2013.01); *H01L 21/76871* (2013.01); *H01L 21/76879* (2013.01); *H01L 2221/1089* (2013.01)

(58) Field of Classification Search
USPC ............... 257/751, 762, E23.16, E21.584; 438/627, 628, 643, 653–656, 687
See application file for complete search history.

(56) References Cited

U.S. PATENT DOCUMENTS

| | | | |
|---|---|---|---|
| 6,130,161 A * | 10/2000 | Ashley et al. | 438/687 |
| 6,239,021 B1 | 5/2001 | Pramanick et al. | |
| 8,148,257 B1 * | 4/2012 | Barth et al. | 438/614 |
| 8,772,158 B2 * | 7/2014 | Ryan et al. | 438/653 |
| 2004/0175845 A1 | 9/2004 | Molla et al. | |
| 2005/0095855 A1 * | 5/2005 | D'urso et al. | 438/678 |
| 2008/0128856 A1 | 6/2008 | Kwak | |

* cited by examiner

*Primary Examiner* — Jasmine Clark
(74) *Attorney, Agent, or Firm* — Lowe Hauptman & Ham, LLP (57) ABSTRACT

A copper interconnect structure in a semiconductor device comprises a dielectric layer having sidewalls and a surface defining an opening in the dielectric layer. The copper interconnect structure also comprises a barrier layer deposited on the sidewalls and the surface of the dielectric layer defining the opening. The copper interconnect structure further comprises a barrier/seed mixed layer deposited on the barrier layer. The copper interconnect structure additionally comprises an adhesive layer deposited on the barrier/seed mixed layer. The copper interconnect structure also comprises a seed layer deposited on the adhesive layer.

20 Claims, 6 Drawing Sheets

COPPER INTERCONNECT STRUCTURE AND METHOD FOR FORMING THE SAME

PRIORITY CLAIM

The present application is a continuation-in-part of U.S. application Ser. No. 13/586,676, filed Aug. 15, 2012, now U.S. Pat. No. 8,941,239, which claims priority of U.S. Provisional Application No. 61/624,154, filed Apr. 13, 2012, which are incorporated herein by reference in their entireties.

FIELD

The disclosure relates generally to the fabrication of semiconductor devices, and more particularly, to a copper interconnect structure and method for forming the same.

BACKGROUND

The use of copper as a conductive interconnect material is favored in semiconductor devices because of the high speed that copper provides. Copper interconnect structures are typically formed using damascene processing technology in which an opening is formed in a dielectric layer, copper is deposited within the opening, and then a polishing/planarization process is used to remove copper from over the dielectric layer, leaving copper inlaid within the opening. However, copper diffuses through dielectric materials, so the copper interconnect structures must be encapsulated by a diffusion barrier layer. Otherwise the diffused copper metal in the dielectric layer may result in current leakage between the interconnect structures. The diffusion barrier layer typically comprises a refractory material. Typical refractory materials used for the barrier layer include tantalum (Ta), tantalum nitride (TaN), titanium (Ti), and titanium nitride (TiN).

Studies have concluded that as the critical dimensions of integrated circuits (IC's) continue to shrink, seams or cracks may develop at a joinder between the copper and the diffusion barrier layer. These seams or cracks lead to the phenomena known as "electromigration" (EM) and "stress migration" that degrades the reliability of the copper interconnect structure.

BRIEF DESCRIPTION OF DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
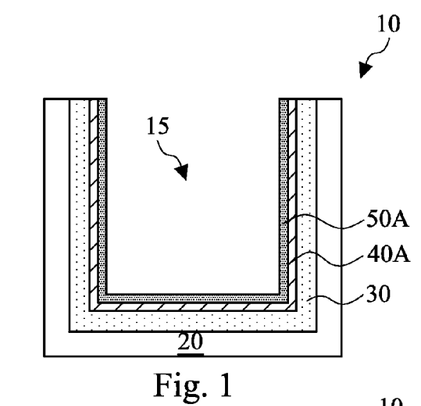
FIG. 1 is a cross-sectional view of a copper interconnect structure at an interim stage of fabrication, in accordance with one or more embodiments.
Figure 2:
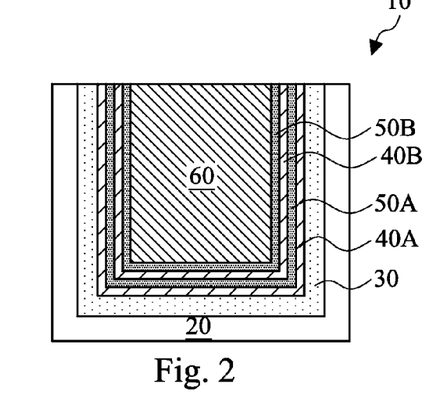
FIG. 2 is a cross-sectional view of the copper interconnect structure at a later stage of fabrication, in accordance with one or more embodiments.

FIGS. 1-2 are cross-sectional side views of a copper interconnect structure 10 at various fabrication stages, in accordance with one or more embodiments. It is understood that FIGS. 1-2 have been simplified for a better understanding of the inventive concepts of the present disclosure.

Referring to FIG. 1, the copper interconnect structure 10 has an opening 15 formed in a dielectric layer 30 of a substrate 20. In some embodiments, the substrate 20 includes one or more insulator, conductor, and/or semiconductor layers. In some embodiments, the substrate 20 comprises an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP; or other suitable material or combination of materials. In some embodiments, the substrate 20 includes a bulk semiconductor, such as bulk silicon, and such a bulk semiconductor optionally includes an epi silicon layer. In some embodiments, the substrate 20 additionally or alternatively includes a semiconductor-on-insulator substrate, such as a silicon-on-insulator (SOI) substrate, or a thin-film transistor (TFT) substrate. In some embodiments, the substrate 20 additionally or alternatively includes a multiple silicon structure or a multilayer compound semiconductor structure.

In some embodiments, the dielectric layer 30 is an intermetal dielectric (IMD) and comprises a dielectric material such as silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, silicon nitride, silicon oxy-nitride and/or other suitable materials. In some embodiments, dielectric layer 30 comprises a low-k material having a dielectric constant, k, less than that of silicon dioxide, which is about 3.9. In some embodiments, the dielectric material is a porous material and is accordingly a porous low-k material. In some embodiments, the low-k dielectric material is a chemical vapor deposition (CVD) low-k material, or a spin-on low-k material. In at least one example embodiment, porous methylsilsesquioxane (MSQ) is used as the low-k material. In some embodiments, the dielectric layer 30 comprises a plurality of dielectric layers, with or without an etch stop layer formed between adjacent dielectric layers.

The copper interconnect structure 10 includes the opening 15 formed in the dielectric layer 30. Opening 15 includes a bottom and sidewalls. In some embodiments, opening 15 is a trench opening, a via opening, or different type of opening within which a conductive layer is to be formed. In some embodiments, the opening 15 comprises a long thin trench that is relatively straight. In some embodiments, opening 15 curves and digresses in bends or other patterns to form conductive lines within a metal layer. In other embodiments, the opening 15 forms a via, contact plug, or other interconnect structure electrically coupled to electrical devices or other conductive lines (not shown) formed in underlying layers.

In some embodiments, the opening 15 is formed by one or more photolithography techniques. Generally, photolithography techniques involve applying a photoresist material (not shown) and exposing the photoresist material in accordance with a desired pattern. The photoresist material is then developed to remove a portion of the photoresist material, thereby exposing an underlying material in accordance with the desired pattern. The remaining photoresist material protects the underlying material from subsequent processing steps, such as etching, performed on the underlying material to form the opening 15 in the dielectric layer 30. After the opening 15 is formed, the remaining photoresist material, if any, is optionally removed. In some embodiments, one or more other processes, such as electron beam lithography (EBL) or another suitable process, are used to form the opening 15.

The process described above described a single-damascene process for illustrative purposes only. In some embodiments, other processes, such as a dual-damascene process, are used to form the opening 15. In some embodiments, a dual-damascene process is used to form a trench and a via through one or more layers of the dielectric layer 30.

Referring still to FIG. 1, a first barrier layer 40A is conformally deposited on the sidewalls and the bottom of opening 15. First barrier layer 40A prevents copper from a later deposited copper plug from diffusing into the surrounding dielectric layer 30; provides high electrical conductivity with low ohmic contact resistance; good adhesion between the substrate 20 and the barrier metal; and/or resistance to electromigration.

In some embodiments, first barrier layer 40A is deposited by one or more of physical vapor deposition (PVD), chemical vapor deposition (CVD), high-density plasma CVD (HDPCVD), atomic layer deposition (ALD), plasma-enhanced (PE-ALD), plasma-enhanced CVD (PECVD), ionized PVD (I-PVD), or other suitable process. First barrier layer 40A is formed of one or more layers of conductive materials, such as tantalum (Ta), tantalum nitride (TaN), titanium (Ti), titanium nitride (TiN), tungsten nitride (WN), cobalt (Co), cobalt tungsten (CoW), $MnO_x$, $MnN_x$, $MnC_x$, $MnSi_xO_y$, other manganese-based materials, ruthenium (Ru), and/or other barrier materials. In some embodiments, first barrier layer 40A has a thickness from about 2 Angstroms to about 50 Angstroms. In at least one example embodiment, first barrier layer 40A has a thickness from about 20 Angstroms to about 30 Angstroms.

A first seed layer 50A is conformally deposited on the first barrier layer 40A. In some embodiments, first seed layer 50A is deposited by physical vapor deposition (PVD), chemical vapor deposition (CVD), atomic layer deposition (ALD), plasma-enhanced (PE-ALD), plasma-enhanced CVD (PECVD), ionized PVD (I-PVD), or other suitable process. In some embodiments, first seed layer 50A comprises copper or copper alloys. In some embodiments, first seed layer 50A is copper-doped onto the first barrier layer 40A by plasma bonding using Argon plasma, for example. First seed layer 50A is formed of one or more layers of conductive materials, such as copper or copper alloys. In some embodiments, first seed layer 50A has a thickness from about 2 Angstroms to about 100 Angstroms. In at least one example embodiment, first seed layer 50A has a thickness from about 40 Angstroms to about 70 Angstroms.

With reference now to FIG. 2, a second barrier layer 40B is conformally deposited on the first seed layer 50A. In some embodiments, second barrier layer 40B is deposited by physical vapor deposition (PVD), chemical vapor deposition (CVD), high-density plasma CVD (HDPCVD), atomic layer deposition (ALD), plasma-enhanced (PE-ALD), plasma-enhanced CVD (PECVD), ionized PVD (I-PVD), or other suitable process. In some embodiments, Second barrier layer 40B is formed of one or more layers of conductive materials, such as tantalum (Ta), tantalum nitride (TaN), titanium (Ti), titanium nitride (TiN), tungsten nitride (WN), cobalt (Co), cobalt tungsten (CoW), $MnO_x$, $MnN_x$, $MnC_x$, $MnSi_xO_y$, other manganese-based materials, ruthenium (Ru) and/or other barrier materials. In some embodiments, second barrier layer 40B has a thickness from about 2 Angstroms to about 50 Angstroms. In at least one example embodiment, second barrier layer 40B has a thickness from about 20 Angstroms to about 30 Angstroms.

A second seed layer 50B is conformally deposited on the second barrier layer 40B. In some embodiments, second seed layer 50B is deposited by physical vapor deposition (PVD), chemical vapor deposition (CVD), or atomic layer deposition (ALD), plasma-enhanced (PE-ALD), plasma-enhanced CVD (PECVD), ionized PVD (I-PVD), or other suitable process. In some embodiments, second seed layer 50B comprises copper or copper alloys. In some embodiments, second seed layer 50B is copper-doped onto the second barrier layer 40B by plasma bonding using Argon plasma, for example. Second seed layer 50B is formed of one or more layers of conductive materials, such as copper or copper alloys and/or other seed materials. In some embodiments, second seed layer 50B has a thickness from about 2 Angstroms to about 100 Angstroms. In at least one example embodiment, second seed layer 50B has a thickness from about 40 Angstroms to about 70 Angstroms.

In some embodiments, one or more of the first barrier layer 40A, the second barrier layer 40B, first seed layer 50A or second seed layer 50B are replaced with a combination barrier/seed mixed layer. Such a barrier/seed mixed layer comprises a mixture of barrier materials and seed materials. Example mixed layers are discussed in further detail with respect to FIGS. 4-7.

In some embodiments, depositing a second set of barrier, seed layers and/or barrier/seed mixed layers, also known as Advanced Gradient Seed (AGS) helps to reduce the occurrence of seams and cracks that may develop at a joinder between a copper layer and a diffusion barrier layer. These seams or cracks lead to the phenomena known as "electromigration" (EM) and "stress migration" that degrade the reliability of the copper interconnect structure. These problems are especially prevalent in copper interconnect structures of advanced node devices and so embodiments of the present invention address these issues.

In other embodiments, a third set of barrier, seed layers and/or barrier/seed mixed layers are deposited in opening 15 of the copper interconnect structure 10. In still other embodiments, a fourth set of barrier, seed layers and/or barrier/seed mixed layers are deposited in opening 15. In still yet other embodiments, a fifth set of barrier, seed layers and/or barrier/seed mixed layers are deposited in opening 15. A number s of sets of barrier, seed layers and/or barrier/seed mixed layers are optionally deposited in opening 15 based on the reduction performance the number of s sets of barrier, seed layers and/or barrier/seed mixed layers has on the occurrence of seams and cracks. For example, if four sets of barrier and seed layers are deposited in the opening 15 of the copper interconnect structure 10 to satisfactorily prevent the occurrence of seams and cracks, then the number s of sets is equal to 4, but if only two sets of barrier and seed layers are necessary to prevent the occurrence of seams and cracks, then s equals 2.

Following the deposition of second seed layer 50B, the opening 15 is ready to be filled with a conductive plug 60. In at least one example embodiment, the conductive plug 60 includes copper. The conductive material employed to form the conductive plug 60 is formed in the opening 15 by one or more sputtering, evaporation, electroless-plating, electroplating and/or other deposition processes. Additional processes are optionally performed to complete the interconnect structure of the semiconductor device 10 such as, for example planarizing the top surface of the conductive plug 60 with a chemical-mechanical polishing (CMP) system and/or depositing a layer of dielectric or passivation material on the conductive plug 60.

In some embodiments, instead of copper, the conductive plug 60 optionally comprises one or more other materials, such as copper alloy, refractory metals, TiSi2, CoSi2, NiSi, PtSi, W, WSi2, metal silicide, TiN, TaN, Al, AlCu, aluminum, aluminum alloy, tungsten, and/or other suitable materials. In some embodiments, the semiconductor device 10 includes a connection structure that connects interconnect layers, an interconnect layer and a substrate, an interconnect layer and a gate, an active region and a gate, an active region and an interconnect layer, or serve other connection purposes. In some embodiments, the semiconductor device 10 includes a connection structure that connects different semiconductor devices, such as a drain region of a first device and the gate of a second device, or a source region of a first device and the gate of a second device.

Figure 3:
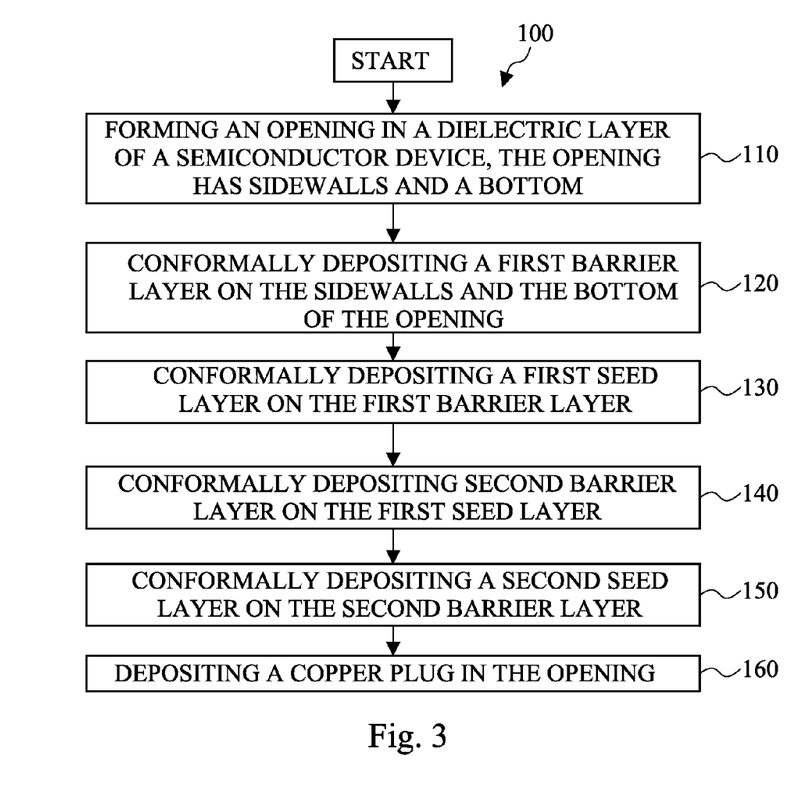
FIG. 3 is a flowchart illustrating a method for fabricating a copper interconnect structure, in accordance with one or more embodiments.

Illustrated in FIG. 3 is a flowchart of a method 100 for forming a copper interconnect structure, in accordance with one or more embodiments. The method 100 includes block 110, in which an opening is formed in a dielectric layer of a semiconductor device. The opening has sidewalls and a bottom. The method 100 includes block 120, in which a first barrier layer is conformally deposited on the sidewalls and the bottom of the opening. The method 100 includes block 130, in which a first seed layer is conformally deposited on the first barrier layer. The method 100 includes block 140, in which a second barrier layer is conformally deposited on the first seed layer. The method 100 includes block 150, in which a second seed layer is conformally deposited on the second barrier layer. The method 100 includes block 160, in which a conductive plug is deposited in the opening.

It is understood that additional processes may be performed before, during, or after the blocks 110-160 of FIG. 3 to complete the fabrication of the semiconductor device, but these additional processes are not discussed herein in detail for the sake of simplicity. For example, in one embodiment, a third barrier layer (not shown) may be conformally deposited on the second seed layer and a third seed layer (not shown) may be conformally deposited on the third barrier layer. In another embodiment, a fourth barrier layer (not shown) may be conformally deposited on the third seed layer and a fourth seed layer (not shown) may be conformally deposited on the fourth barrier layer. In fact, according to aspects of the present disclosure and as discussed above, s sets of barrier and a seed layers may be deposited in the opening of the copper interconnect structure. One of ordinary skill in the art understands that a number s of sets of barrier and seed layers that need to be deposited in the opening of the interconnect structure to prevent electromigration and stress migration that degrade the reliability of the copper interconnect structure may be deposited.

Figure 4:
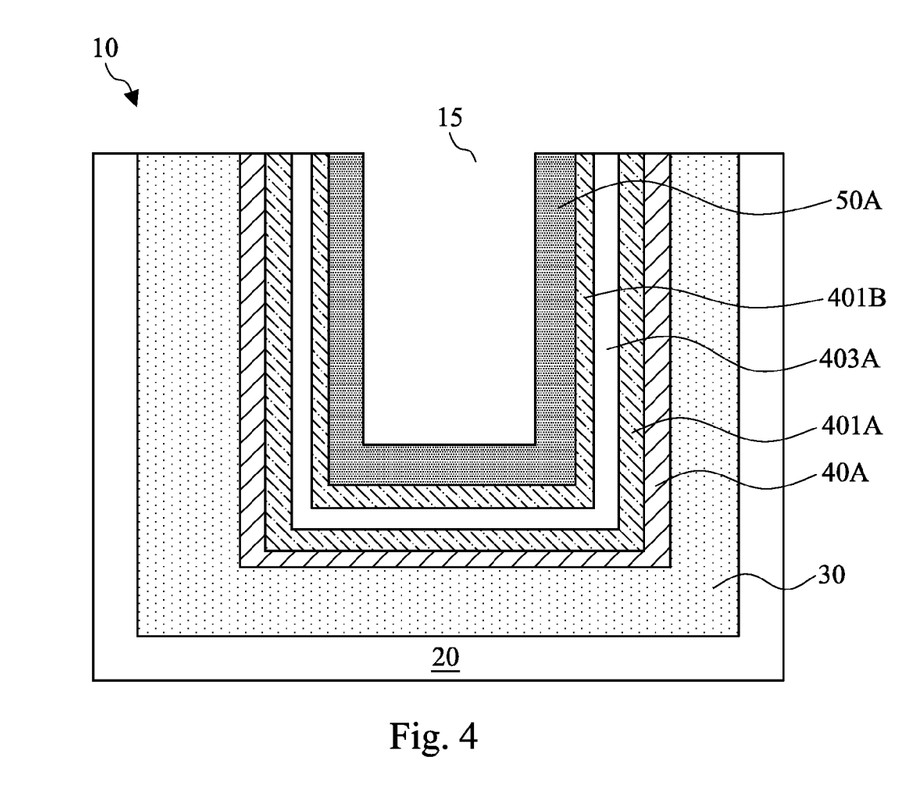
FIG. 4 is a cross-sectional view of a copper interconnect structure at an interim stage of fabrication, in accordance with one or more embodiments.
Figure 5:
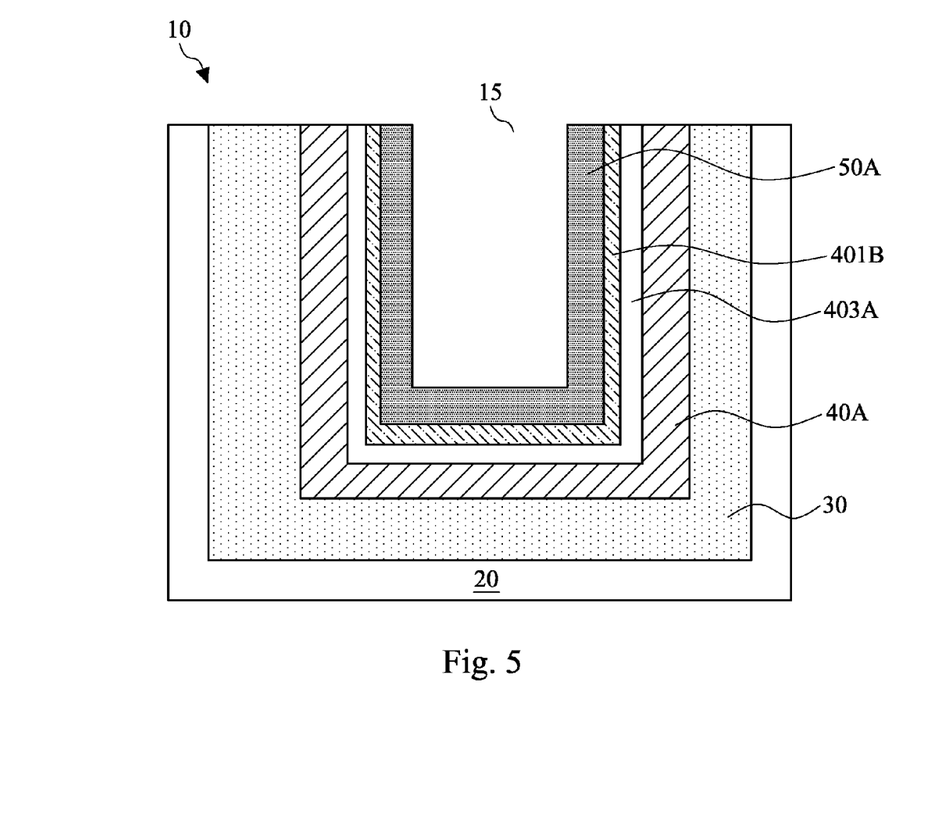
FIG. 5 is a cross-sectional view of a copper interconnect structure at an interim stage of fabrication, in accordance with one or more embodiments.
Figure 6:
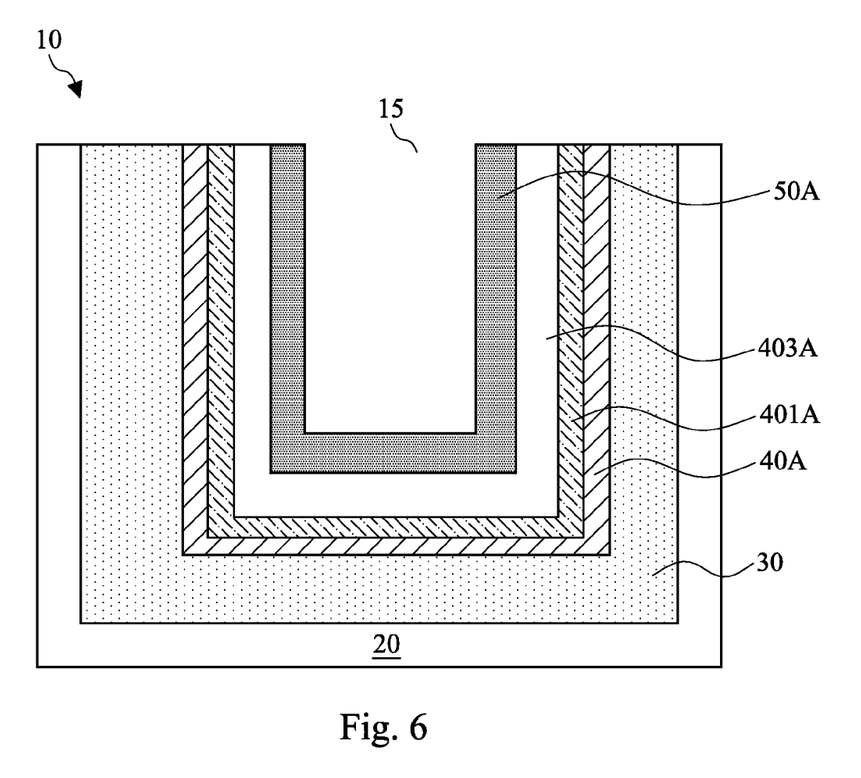
FIG. 6 is a cross-sectional view of a copper interconnect structure at an interim stage of fabrication, in accordance with one or more embodiments.

FIGS. 4-6 are cross-sectional side views of copper interconnect structure 10, in accordance with one or more embodiments.

Referring to FIG. 4, the copper interconnect structure 10 has opening 15 formed in the dielectric layer 30 of the substrate 20. The first barrier layer 40A is conformally deposited on the sidewalls and the bottom of opening 15. A first adhesive layer 401A is conformally deposited on the first barrier layer 40A. The first adhesive layer 401A comprises one or more of Co, Ru, Ta, Mo, W, Os, a glue, a polymer, an epoxy, a film, or other suitable material.

A first barrier/seed mixed layer 403A is conformally deposited on the first adhesive layer 401A. The first barrier/seed mixed layer 403A comprises a mix of materials of the discussed barrier layers 40A/40B and seed layers 50A/50B. First barrier/seed mixed layer 403A is deposited by physical vapor deposition (PVD), chemical vapor deposition (CVD), or atomic layer deposition (ALD), any variation or enhancement thereof such as plasma-enhanced ALD (PE-ALD), plasma-enhanced CVD (PE-CVD), or other suitable process.

In some embodiments, the first barrier/seed mixed layer 403B comprises an alternating arrangement of barrier layer and seed layer materials. The alternating arrangement of barrier and seed layer materials are formed, for example, by alternating deposition processes for barrier and seed layer materials when forming the first barrier/seed mixed layer 403B. In some embodiments, the first barrier/seed mixed barrier layer 403A is deposited by a plasma-assisted or enhanced ALD or CVD process in which one of the first barrier layer 40A, the second barrier layer 40B (FIG. 1), the first seed layer 50A or the second seed layer 50B (FIG. 1) is first formed as a base layer, and then the plasma-assisted or enhanced ALD or CVD process is performed to mix the barrier layer material with the seed layer material that is first deposited or the seed layer material with the barrier layer material that is first deposited.

A second adhesive layer 401B is conformally deposited on the first barrier/seed mixed layer 403A. The second adhesive layer 401B comprises one or more of Co, Ru, Ta, Mo, W, Os, a glue, a polymer, an epoxy, a film, or other suitable material. In some embodiments, the first adhesive layer 401A and the second adhesive layer 401B comprise a same material or a same combination of materials. In other embodiments, the first adhesive layer 401A and the second adhesive layer 401B comprise a different material or a different combination of materials. A first seed layer 50A is conformally deposited on the second adhesive layer 401B.

In some embodiments, the copper interconnect structure 10 comprises a different number of barrier/seed mixed layers. For example, a second barrier/seed mixed layer 403B (not shown) is optionally deposited in place of first seed layer 50A, and a third adhesive layer 401C (not shown) is optionally conformally deposited on the second barrier/seed mixed layer 403B, on which the first seed layer 50A is optionally conformally deposited. In some embodiments, additional barrier/seed mixed layers are optionally conformally deposited on one or more other barrier/seed mixed layers.

Referring to FIG. 5, the copper interconnect structure 10 has opening 15 formed in the dielectric layer 30 of the substrate 20. The first barrier layer 40A is conformally deposited on the sidewalls and the bottom of opening 15. The first barrier/seed mixed layer 403A is conformally deposited on the first barrier layer 40A. In some embodiments, the first barrier/seed mixed layer 403A is deposited on the first barrier layer 40A by mixing seed layer materials via a plasma-assisted or enhanced ALD or CVD process on a portion of the first barrier layer 40A, thereby forming the first barrier/seed mixed layer 403A. The first adhesive layer 401A is conformally deposited on the first barrier/seed mixed layer 403A. The first seed layer 50A is conformally deposited on the first adhesive layer 401A.

Referring to FIG. 6, the copper interconnect structure 10 has opening 15 formed in the dielectric layer 30 of the substrate 20. The first barrier layer 40A is conformally deposited on the sidewalls and the bottom of opening 15. The first adhesive layer 401A is conformally deposited on the first barrier layer 40A. The first barrier/seed mixed layer 403A is conformally deposited on the first adhesive layer 401A. In some embodiments, the first barrier/seed mixed layer 403A is deposited on the first adhesive layer 401a by depositing a seed material layer or a barrier material layer and by mixing the other of the seed material or the barrier layer material via a plasma-assisted or enhanced ALD or CVD process on a portion of the barrier layer material or the seed layer material, thereby forming the first barrier/seed mixed layer 403A. The first seed layer 50A is conformally deposited on the first barrier/seed mixed layer 403A.

Figure 7:
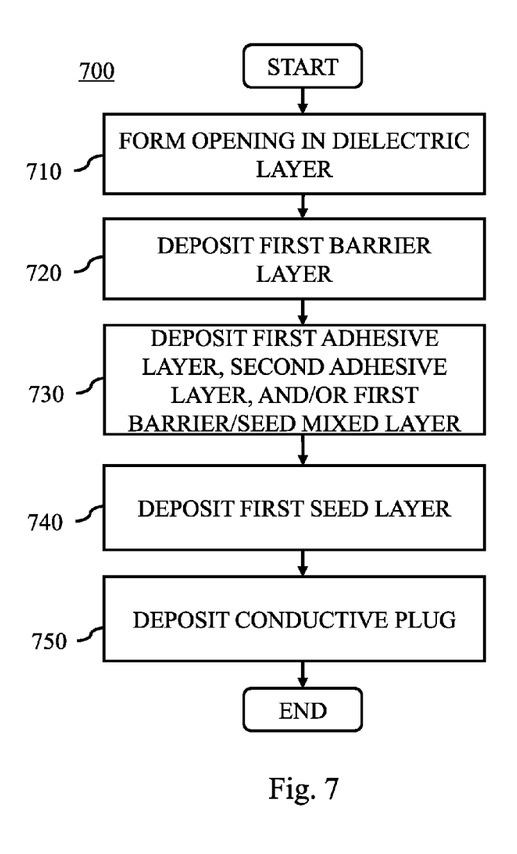
FIG. 7 is a flowchart illustrating a method for fabricating a copper interconnect structure, in accordance with one or more embodiments.

FIG. 7 is a flowchart of a method 700 for forming a copper interconnect structure, in accordance with one or more embodiments. Method 700 includes block 710, in which an opening is formed in a dielectric layer of a semiconductor device. The opening has sidewalls and a bottom. The method 700 includes block 720, in which a first barrier layer is conformally deposited on the sidewalls and the bottom of the opening. The method 700 includes block 730, in which one or more of a first adhesive layer, a second adhesive layer, or a first barrier/seed mixed layer is conformally deposited in one or more combinations or orders on the first barrier layer. The method 700 includes block 740, in which a first seed layer is conformally deposited on at least one of the first adhesive layer, the second adhesive layer, or the first barrier/seed mixed layer. The method 700 includes block 750, in which a conductive plug is deposited in the opening.

It is understood that additional processes may be performed before, during, or after the blocks 710-750 of FIG. 7 to complete the fabrication of the semiconductor device, but these additional processes are not discussed herein in detail for the sake of simplicity. In some embodiments, s sets of barrier, seed, barrier/seed mixed, and adhesive layers are optionally deposited in the opening of the copper interconnect structure in any order or combination. For example, a first barrier layer 40A (FIG. 1), a second barrier layer 40B (FIG. 1), a first barrier/seed mixed layer 403A (FIG. 4), a first adhesive layer 401A (FIG. 4), and a first seed layer 50A (FIG. 1) are optionally formed on substrate 20 (FIG. 1). One of ordinary skill in the art understands that a number s of sets of barrier, seed, barrier/seed mixed, and/or adhesive layers are optionally deposited in the opening of the interconnect structure to prevent electromigration and stress migration that degrade the reliability of the copper interconnect structure.

Embodiments of the present disclosure provides a copper interconnect structure 10 having robust reliability, low copper line resistance, better adhesion between copper and the barrier layer(s) and reduces the phenomena of electromigration (EM) and/or stress migration effects that may degrade the reliability of the copper interconnect structure. The method of the present disclosure is capable of being applied to other applications where copper diffusion across a copper to dielectric interface is a concern.

An aspect of this description relates to a copper interconnect structure in a semiconductor device that comprises a dielectric layer having sidewalls and a surface defining an opening in the dielectric layer. The copper interconnect structure also comprises a barrier layer deposited on the sidewalls and the surface of the dielectric layer defining the opening. The copper interconnect structure further comprises a barrier/seed mixed layer deposited on the barrier layer. The copper interconnect structure additionally comprises an adhesive layer deposited on the barrier/seed mixed layer. The copper interconnect structure also comprises a seed layer deposited on the adhesive layer.

Another aspect of this description relates to a method for forming a copper interconnect structure in a semiconductor device. The method comprises forming an opening in a dielectric layer of the semiconductor device. The opening is defined by sidewalls and a surface of the dielectric layer. The method also comprises depositing a barrier layer on the sidewalls and the surface of the dielectric layer. The method further comprises depositing a barrier/seed mixed layer on the barrier layer. The method additionally comprises depositing an adhesive layer on the barrier/seed mixed layer. The method also comprises depositing a seed layer on the adhesive layer.

A further aspect of this description relates to a copper interconnect structure in a semiconductor device that comprises a dielectric layer having sidewalls and a surface defining an opening in the dielectric layer. The copper interconnect structure also comprises a barrier layer deposited on the sidewalls and the surface of the dielectric layer defining the opening. The copper interconnect structure further comprises a first adhesive layer deposited on the barrier layer. The copper interconnect structure additionally comprises a barrier/seed mixed layer deposited on the first adhesive layer. The copper interconnect structure also comprises a second adhesive layer deposited on the barrier/seed mixed layer. The copper interconnect structure additionally comprises a seed layer deposited on the second adhesive layer.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A copper interconnect structure in a semiconductor device, comprising:
    a dielectric layer having sidewalls and a surface defining an opening in the dielectric layer;
    a barrier layer deposited on the sidewalls and the surface of the dielectric layer defining the opening;
    a barrier/seed mixed layer deposited on the barrier layer;
    an adhesive layer deposited on the barrier/seed mixed layer; and
    a seed layer deposited on the adhesive layer.

2. The copper interconnect structure of claim 1, wherein the barrier/seed mixed layer comprises one or more barrier materials and one or more seed materials,
wherein the one or more barrier materials comprise one or more of tantalum (Ta), tantalum nitride (TaN), titanium (Ti), titanium nitride (TiN), tungsten nitride (WN), cobalt (Co), cobalt tungsten (CoW), $MnO_x$, $MnN_x$, $MnC_x$, $MnSi_xO_y$, another manganese-based material, or ruthenium (Ru), and the one or more seed materials comprise one or more of copper or a copper alloy.

3. The copper interconnect structure of claim 2, wherein the barrier/seed mixed layer comprises alternating barrier materials and seed materials.

4. The copper interconnect structure of claim 2, wherein the barrier/seed mixed layer comprises a blend of barrier materials and seed materials.

5. The copper interconnect structure of claim 4, wherein the blend of barrier materials and seed materials comprises a base barrier material having seed material deposited therein.

6. The copper interconnect structure of claim 4, wherein the blend of barrier materials and seed materials comprises a base seed material having barrier material deposited therein.

7. The copper interconnect structure of claim 1, wherein the barrier layer comprises one or more barrier materials of tantalum (Ta), tantalum nitride (TaN), titanium (Ti), titanium nitride (TiN), tungsten nitride (WN), cobalt (Co), cobalt tungsten (CoW), $MnO_x$, $MnN_x$, $MnC_x$, $MnSi_xO_y$, another manganese-based material, or ruthenium (Ru).

8. The copper interconnect structure of claim 7, wherein the barrier/seed mixed layer comprises one or more enhanced barrier materials, the barrier materials of the barrier/seed mixed layer being enhanced by a plasma-enhanced deposition process.

9. The copper interconnect structure of claim 1, wherein the seed layer comprises copper or a copper alloy.

10. The copper interconnect structure of claim 1, further comprising a conductive plug deposited in the opening.

11. A method for forming a copper interconnect structure in a semiconductor device, the method comprising:
forming an opening in a dielectric layer of the semiconductor device, the opening being defined by sidewalls and a surface of the dielectric layer;
depositing a barrier layer on the sidewalls and the surface of the dielectric layer;
depositing a barrier/seed mixed layer on the barrier layer;
depositing an adhesive layer on the barrier/seed mixed layer; and
depositing a seed layer on the adhesive layer.

12. The method of claim 11, wherein the barrier/seed mixed layer comprises one or more barrier materials and one or more seed materials,
wherein the one or more barrier materials comprise one or more of tantalum (Ta), tantalum nitride (TaN), titanium (Ti), titanium nitride (TiN), tungsten nitride (WN), cobalt (Co), cobalt tungsten (CoW), MnOx, MnNx, MnCx, MnSixOy, another manganese-based material, or ruthenium (Ru), and the one or more seed materials comprise one or more of copper or a copper alloy.

13. The method of claim 12, wherein the barrier/seed mixed layer comprises alternating barrier materials and seed materials, and the barrier/seed mixed layer is deposited by alternating barrier material and seed material deposition processes.

14. The method of claim 12, wherein the barrier/seed mixed layer comprises a blend of barrier materials and seed materials.

15. The method of claim 14, wherein the blend of barrier materials and seed materials comprises a base barrier material having seed material deposited therein by a deposition process.

16. The method of claim 14, wherein the blend of barrier materials and seed materials comprises a base seed material having barrier material deposited therein by a deposition process.

17. The method of claim 11, wherein the barrier layer comprises one or more barrier materials of tantalum (Ta), tantalum nitride (TaN), titanium (Ti), titanium nitride (TiN), tungsten nitride (WN), cobalt (Co), cobalt tungsten (CoW), MnOx, MnNx, MnCx, MnSixOy, another manganese-based material, or ruthenium (Ru).

18. The method of claim 17, wherein the barrier/seed mixed layer comprises one or more enhanced barrier materials, and the barrier/seed mixed layer is deposited by performing a plasma-enhanced deposition process on at least a portion of the barrier materials of the barrier layer.

19. A copper interconnect structure in a semiconductor device, comprising:
a dielectric layer having sidewalls and a surface defining an opening in the dielectric layer;
a barrier layer deposited on the sidewalls and the surface of the dielectric layer defining the opening;
a first adhesive layer deposited on the barrier layer;
a barrier/seed mixed layer deposited on the first adhesive layer;
a second adhesive layer deposited on the barrier/seed mixed layer; and
a seed layer deposited on the second adhesive layer.

20. The copper interconnect structure of claim 19, wherein the barrier/seed mixed layer comprises one or more barrier materials and one or more seed materials,
wherein the one or more barrier materials comprise one or more of tantalum (Ta), tantalum nitride (TaN), titanium (Ti), titanium nitride (TiN), tungsten nitride (WN), cobalt (Co), cobalt tungsten (CoW), $MnO_x$, $MnN_x$, $MnC_x$, $MnSi_xO_y$, another manganese-based material, or ruthenium (Ru), and the one or more seed materials comprise one or more of copper or a copper alloy.

* * * * *